(12) United States Patent
Wortman

(10) Patent No.: US 6,669,042 B1
(45) Date of Patent: Dec. 30, 2003

(54) INTEGRATED POSITIONING AND LOCKING DEVICE

(75) Inventor: Michael Wortman, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/262,270

(22) Filed: Sep. 30, 2002

(51) Int. Cl.[7] .......................... H02G 3/08; B65D 43/04
(52) U.S. Cl. .................. 220/3.8; 220/4.02; 220/281; 220/326
(58) Field of Search ................. 220/3.8, 4.02, 220/281, 326; 329/440

(56) References Cited

U.S. PATENT DOCUMENTS

| | | | | |
|---|---|---|---|---|
| 2,804,986 A | * | 9/1957 | Jeffers et al. | 220/812 |
| 3,024,937 A | * | 3/1962 | Kool | 220/3.8 |
| 3,029,964 A | * | 4/1962 | Hudson et al. | 220/3.4 |
| 5,497,893 A | * | 3/1996 | Mangone, Jr. | 220/3.8 |
| 6,346,624 B1 | * | 2/2002 | Norris et al. | 548/311.1 |
| 6,390,320 B2 | * | 5/2002 | Hurst et al. | 220/241 |

* cited by examiner

Primary Examiner—Joseph Man-Fu Moy

(57) ABSTRACT

An integrated positioning and locking device is disclosed. The integrated positioning and locking device is well suited for installing an assembly onto a chassis. In particular, the integrated positioning and locking device has a latch formed in an external wall of the assembly. The latch latches against the chassis. Moreover, the latch includes a lip which points externally from the external wall. In addition, the integrated positioning and locking device further includes an inner wall for blocking access through the external wall to an internal region of the assembly when the assembly is in an installed position on the chassis. Furthermore, the integrated positioning and locking device has a T-shaped boss integrated into the inner wall for positioning the assembly relative to the chassis to facilitate placing the latch into a latched position for locking the assembly in the installed position.

20 Claims, 11 Drawing Sheets

INTEGRATED POSITIONING AND LOCKING DEVICE

BACKGROUND OF THE INVENTION

1. Field of the Invention

Embodiments of the present invention generally relate to an assembly and a chassis. More particularly, embodiments of the present invention relate to the positioning and locking of an assembly relative to a chassis.

2. Related Art

In the technology industry and other industries, a variety of design concepts are used to design equipment. One widely utilized design concept is the chassis-based design. In the chassis-based design, a chassis (or mechanical structure) is specifically designed to support numerous components internally. This chassis-based design is praised for its high manufacturability and serviceability. Typically, a panel, a housing, a bezel, or other assembly is installed onto the chassis to enhance the aesthetic appearance, provide protection, provide additional functionality, or for any other purpose.

In general, the installation of the panel, the housing, the bezel, or other assembly requires use of hardware (e.g., screws) and tools. This conventional installation may be frustrating because of several reasons. The hardware can be misplaced. On other occasions, tools may not be readily available. Moreover, the conventional installation typically requires many installations steps, whereas several of these installation steps are not user friendly. For example, holes in the assembly have to be manually aligned with holes in the chassis while attempting to insert small and slippery screws, a task that can be difficult.

Due to the problems with hardware-based installations, attention has been focused on molding technologies. In particular, plastics and molding technologies are being utilized to mold the panel, the housing, the bezel, or other assembly. Specifically, the assembly may be molded with features that are intended to improve the installation of the assembly onto the chassis.

Unfortunately, these molding approaches are deficient in general. For example, the assembly may have features that necessitate the use of expensive molding tools. Some of these features are not structurally robust. Additionally, the features may be thick, causing sinks that are cosmetically unacceptable in injection-molded assemblies. Lastly, the molded assembly may not simplify or reduce the installation process.

Therefore, these conventional installation techniques are all problematic, undesirable, and suffer different drawbacks.

SUMMARY OF THE INVENTION

An integrated positioning and locking device is disclosed. The integrated positioning and locking device is well suited for installing an assembly onto a chassis. In particular, the integrated positioning and locking device has a latch formed in an external wall of the assembly. The latch latches against the chassis. Moreover, the latch includes a lip which points externally from the external wall. In addition, the integrated positioning and locking device further includes an inner wall for blocking access through the external wall to an internal region of the assembly when the assembly is in an installed position on the chassis. Furthermore, the integrated positioning and locking device has a T-shaped boss integrated into the inner wall for positioning the assembly relative to the chassis to facilitate placing the latch into a latched position for locking the assembly in the installed position. The T-shaped boss includes a leading end which guides the assembly into the installed position, is spherically shaped, and is higher than the inner wall and the latch.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

Figure 1:
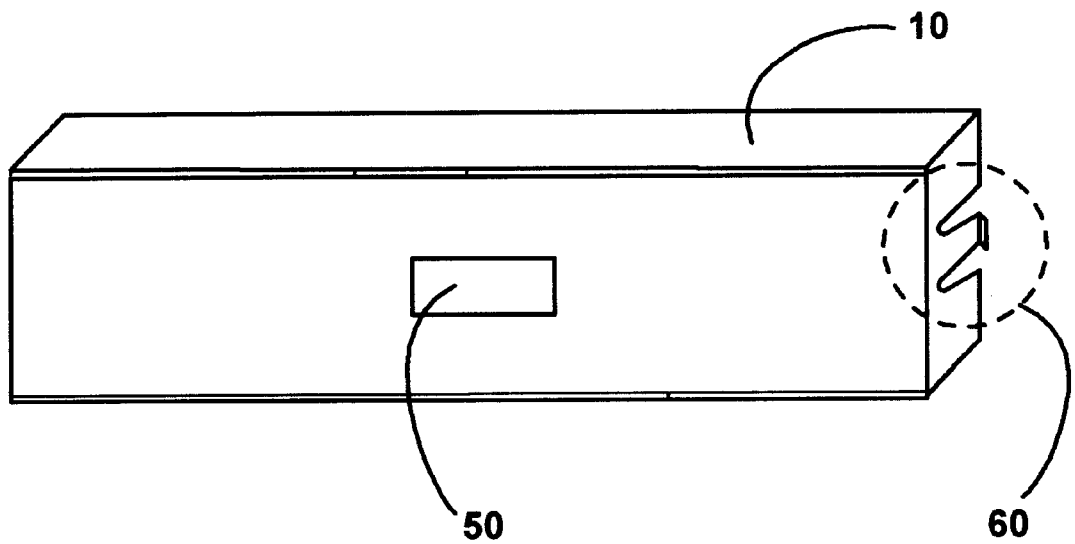
FIG. 1 illustrates a front view of a control panel having an integrated positioning and locking device in accordance with an embodiment of the present invention.

FIG. 1 illustrates a front view of a control panel 100 having an integrated positioning and locking device in accordance with an embodiment of the present invention.

The control panel 100 includes a display 50 and an external wall 10. The integrated positioning and locking device includes a latch 60 formed in the external wall 10. The integrated positioning and locking device facilitates installing the control panel 100 onto a chassis (e.g., see FIG. 10). Although a control panel 100 is shown in FIG. 1, it should be understood that the integrated positioning and locking device is well suited for use with any panel, housing, bezel, or other assembly.

Figure 2:
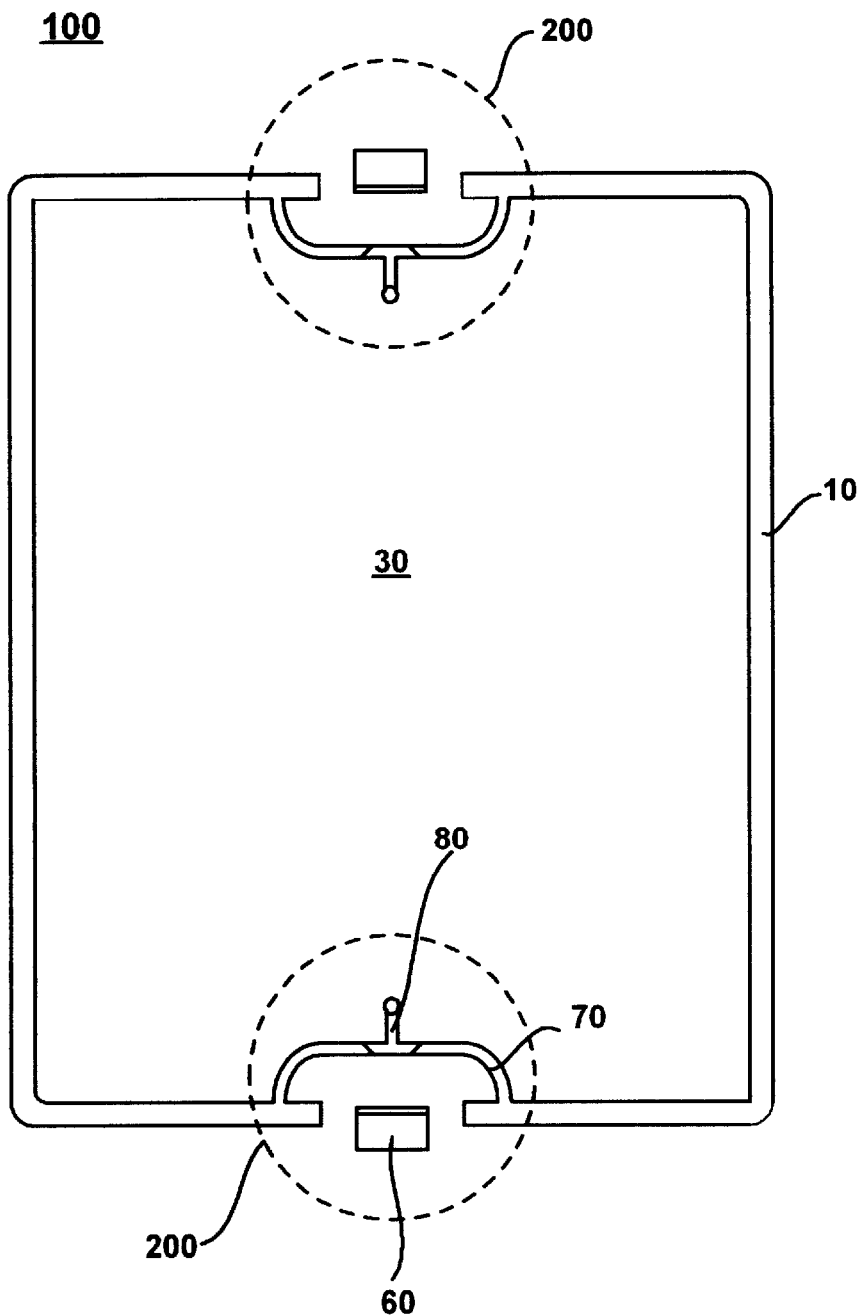
FIG. 2 illustrates a rear view of a control panel having an integrated positioning and locking device in accordance with an embodiment of the present invention.

A rear view of the control panel 100 having an integrated positioning and locking device 200 in accordance with an embodiment of the present invention is depicted in FIG. 2. As shown in FIG. 2, the control panel 100 has a pair of integrated positioning and locking devices 200. It should be understood that the control panel 100 can have other than two integrated positioning and locking devices 200.

Figure 10:
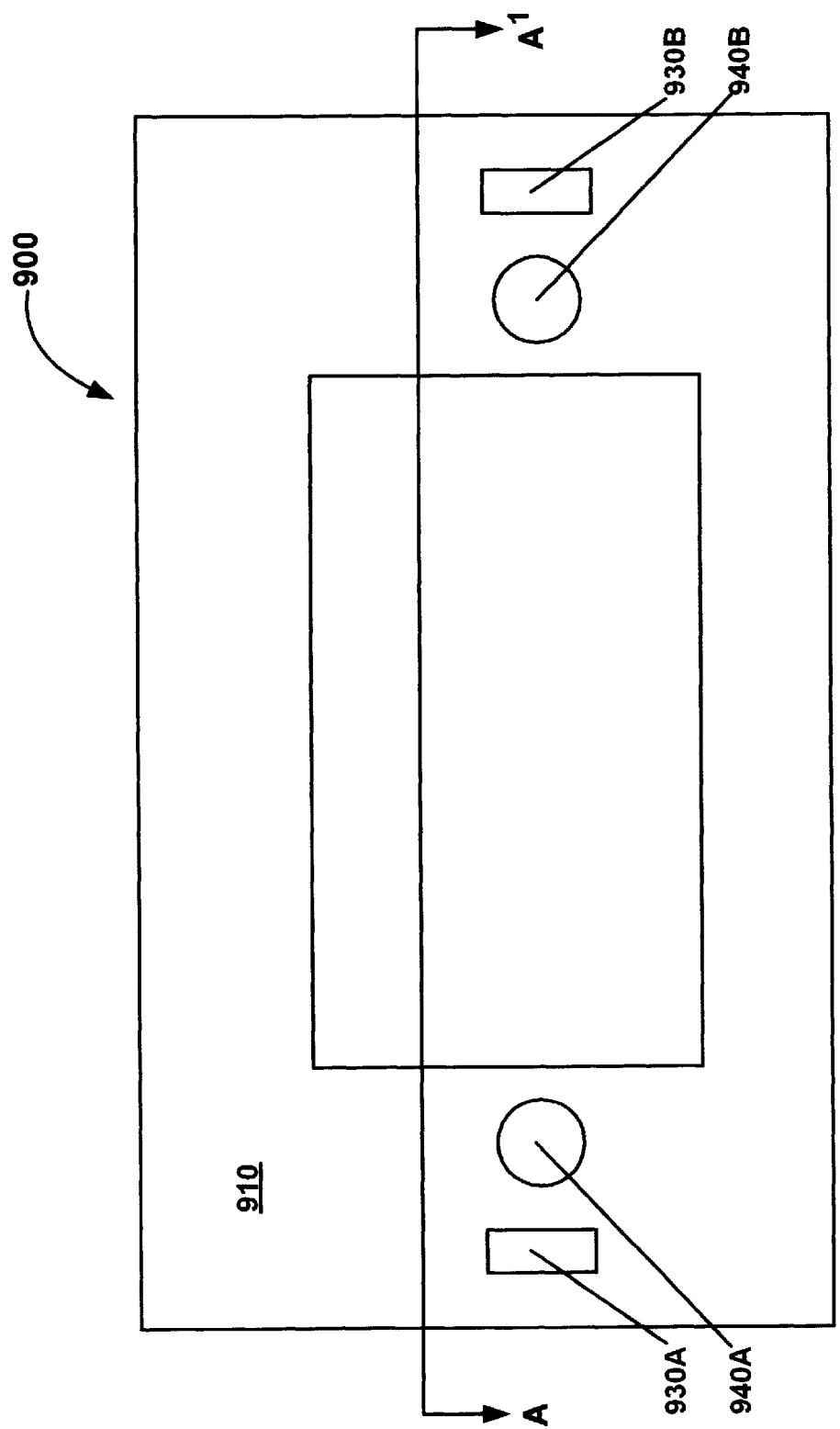
FIG. 10 illustrates a chassis in accordance with an embodiment of the present invention.

The integrated positioning and locking device 200 includes a latch 60 formed in the external wall 10 of the control panel 100 and an inner wall 70 for blocking access through the external wall 10 to an internal region 30 of the control panel 10 when the control panel 10 is in an installed position on the chassis (e.g., see FIG. 10). Moreover, the integrated positioning and locking device 200 further includes a T-shaped boss 80 integrated into the inner wall 70 for positioning the control panel 100 relative to the chassis.

Figure 3:
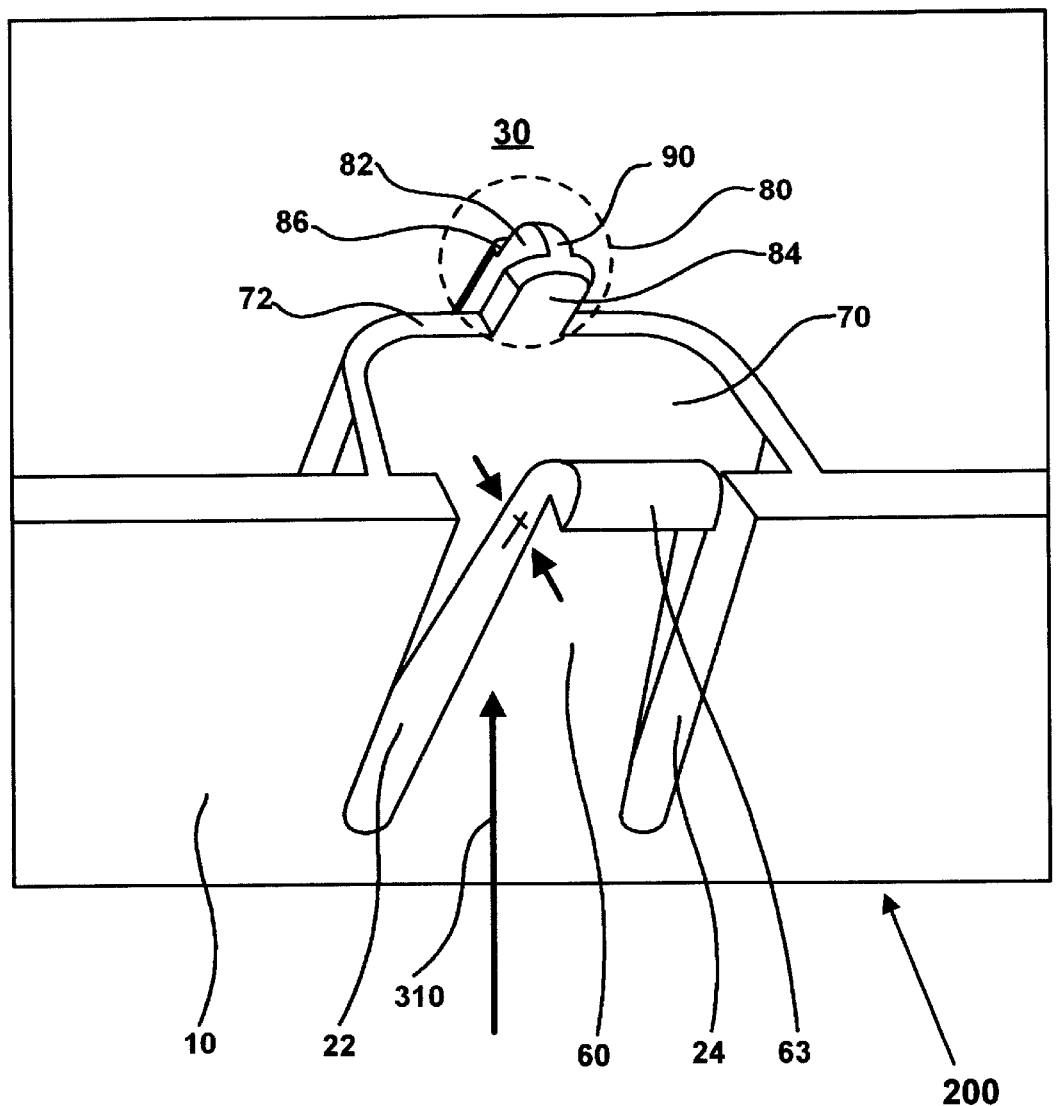
FIG. 3 illustrates a left perspective view of an integrated positioning and locking device in accordance with an embodiment of the present invention.

FIG. 3 illustrates a left perspective view of an integrated positioning and locking device 200 in accordance with an embodiment of the present invention. As shown in FIG. 3, the integrated positioning and locking device 200 has a latch 60, an inner wall 70, and a T-shaped boss 80. The integrated positioning and locking device 200 enables positive positioning and tool-less installation of the control panel 100 onto a chassis, (e.g., a sheet metal chassis, a plastic chassis, etc.). In an embodiment, the integrated positioning and locking device 200 and the control panel 100 are molded using a plastic and an injection-molding process. A variety of plastics can be used. A polycarbonate-ABS blend, an ABS, and a styrene are examples of suitable plastics. The integrated positioning and locking device 200 is easily moldable into a panel, a housing, a bezel, or other assembly. By molding the integrated positioning and locking device 200 and the control panel 100 with an injection-molding core and cavity as an integrated part, tolerance build-up is minimized, allowing for consistency among the fabricated control panels.

The latch 60 is formed in the external wall 10 of the control panel 100. The latch 60 latches against the chassis (FIG. 10) to lock firmly the control panel 100 in an installed position. Moreover, the plastic material that is used to mold the control panel 100 and the integrated positioning and locking device 200 provides the spring-action for the latch 60. Thus, upon depressing the latch 60 as indicated by the arrow 310, the latch 60 bends towards the inner wall 70. When the latch 60 is released, the latch 60 snaps back to a flush position with the external wall 10.

As depicted in FIG. 3, the latch 60 includes a lip 63 that points externally from the external wall 10, whereas the lip 63 is inserted through a corresponding latching hole in the chassis (FIG. 10). Hence, the latch 60 and the undercut for the lip 63 can be fabricated using a straight pull in an injection-molding process without slides or lifters. Typically, the injection-molding process for a panel having a conventional latch requires an injection mold that has complex slides or lifters to create the undercut for the lip. These slides or lifters are expensive mold tool details that require moving parts and provide areas that can wear down, reducing the life of the mold tool. By forming the latch 60 in the external wall 10 and pointing the latch 60 outward, the slides or lifters are avoided. This reduces mold tooling and fabrication costs substantially.

Additionally, the thickness t of the latch 60 decreases as measured from the base to the lip 60 to facilitate bending the latch 60 when depressed as indicated by the arrow 310.

Continuing with FIG. 3, the inner wall 70 blocks access though the external wall 10 to the internal region 30 of the control panel 100 when the control panel 100 is in an installed position on the chassis (FIG. 10), whereas the internal region 30 may have components (e.g., circuit board). The external wall 10 has the slots 22 and 24 for defining the latch 60. The inner wall 70 (or screen wall) prevents visual access as well as physical access (such as by a probe) to the internal region 30 of the control panel 100 through the slots 22 and 24, whereas the inner Wall 70 extends from the rear surface of the control panel 100 to prevent damage to the internal region 30. As depicted in FIG. 3, the inner wall 70 forms a U-shape with the external wall 10 to cover the slots 22 and 24, whereas the external wall 10 and the inner wall 70 are substantially equivalent in height.

Also, the inner wall 70 has a top edge 72 that functions like a stop when the control panel 100 is installed onto the chassis. When the control panel 100 is in the installed position, the top edge 72 of the inner wall 70 rests against the surface (or face) of the chassis, creating a cavity whose walls are defined by the inner wall 70, the external wall 10, the rear surface of the control panel 100, and the surface of the chassis. Moreover, the inner wall 70 increases the mechanical integrity of the present invention, providing a more robust implementation compared to prior designs.

Still referring to FIG. 3, the T-shaped boss 80 is integrated into the inner wall 70. The T-shaped boss 80 facilitates positioning the control panel 1 00 relative to the chassis (FIG. 10). In particular, the T-shaped boss 80 facilitates placing the latch 60 into a latched position for locking the control panel 100 in the installed position on the chassis. The T-shaped boss 80 has a leading end 90 that is spherically shaped for guiding the control panel 100 into the installed position. The T-shaped boss 80 functions as a locating feature. The spherical shape of the leading end 90 enables easy insertion of the leading end 90 into a corresponding positioning hole in the chassis (FIG. 10). The T-shaped boss 80 extends higher than the inner wall 70 and the latch 60 from the rear surface of the control panel 100.

As depicted in FIG. 3, the T-shaped boss 80 includes a plurality of members that form the offset "T" structure of the T-shaped boss 80. A first member 82 is perpendicular to the inner wall 70 in a direction that is opposite from the latch 60. The first member 82 forms a vertical bar of the T-shaped boss 80. Additionally, the first member 82 includes a stop 86 that rests against the chassis (FIG. 10) when the control panel 100 is installed onto the chassis. A second member 84 extends parallel from the top edge of the inner wall 70. The second member 84 forms an upper section of a cross bar of the T-shaped boss. Moreover, the inner wall 70 forms a lower section of the cross bar of the T-shaped boss 80.

The cross-section of the T-shaped boss 80 increases as measured from the leading end 90 to the rear surface of the control panel 100. This provides a stop and support in the direction of the insertion motion into the corresponding positioning hole of the chassis. Moreover, the members of the T-shaped boss 80 locate with tight tolerance into the corresponding positioning hole of the chassis. Without the T-shaped boss 80, the control panel 100 would be located by the latch 60, which is flexible and would allow the control panel 100 to move while in the installed position relative to the chassis. The combination of the T-shaped boss 80 and the latch 60 maintains the control panel 100 firmly locked against the chassis (FIG. 10) while in the installed position.

Moreover, the T-shaped boss 80 avoids the molding of a thick part. In the injection-molding process, a thick part creates a sink that is cosmetically unacceptable. Since the members of the T-shaped boss 80 are thin, the T-shaped boss 80 does not create a sink. The offset "T" feature of the T-shaped boss 80 enables the T-shaped boss 80 to function like a boss of substantially larger diameter. The T-shaped boss 80 allows a more robust and easier alignment and installation of the control panel 100 onto the chassis (FIG. 10). Moreover, use of a pair of integrated positioning and locking devices 200 provides two T-shaped bosses 80 that are in a fixed relationship to each other, improving control panel 100 to chassis (FIG. 10) alignment.

Figure 4:
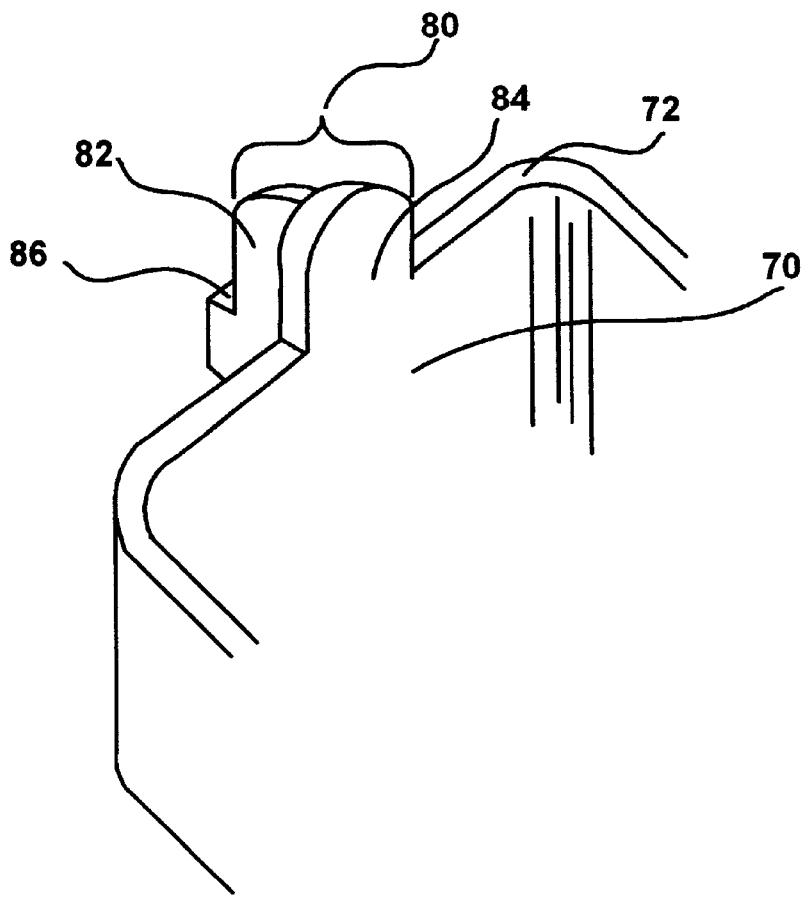
FIG. 4 illustrates an inner wall and a T-shaped boss of an integrated positioning and locking device in accordance with an embodiment of the present invention.
Figure 5:
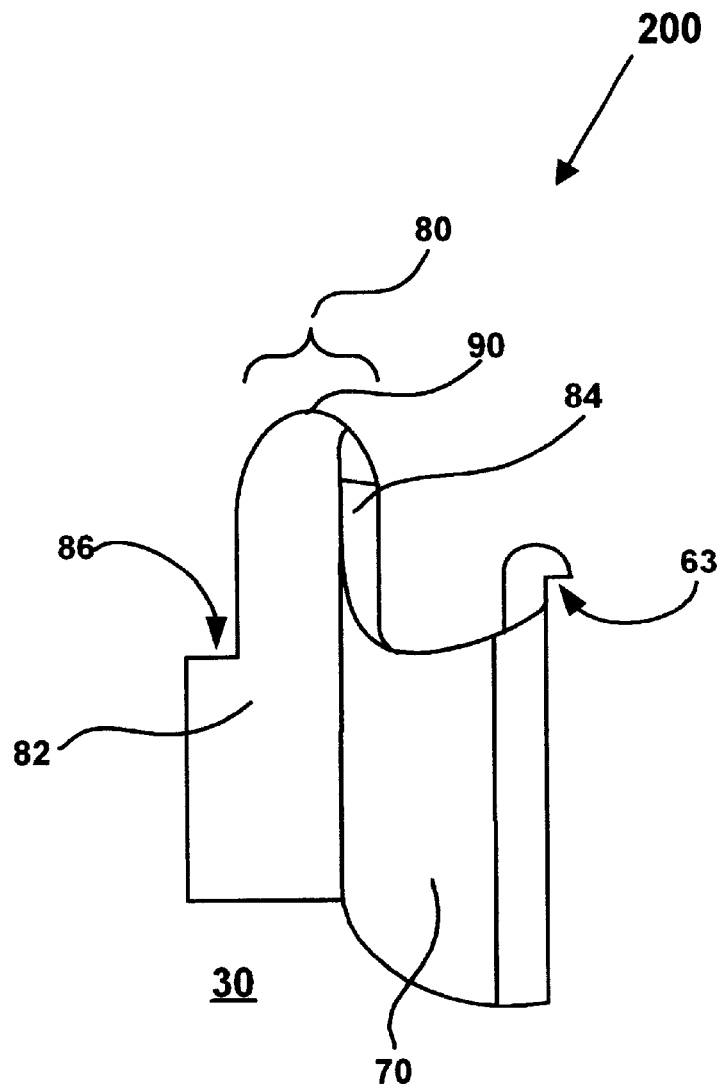
FIG. 5 illustrates a side view of an integrated positioning and locking device in accordance with an embodiment of the present invention.

FIG. 4 illustrates an inner wall 70 and a T-shaped boss 80 of an integrated positioning and locking device 200 of FIG. 3 in accordance with an embodiment of the present invention. As described above, the T-shaped boss 80 includes a first member 82, a second member 84, and a stop 86. The inner wall 70 has the top edge 72. Furthermore, FIG. 5 illustrates a side view of an integrated positioning and locking device 200 of FIG. 3 in accordance with an embodiment of the present invention. The first member 82 and the inner wall 70 are shown extending from the rear surface of the internal region 30 of the control panel 100. Moreover, FIG. 5 depicts the spherical shape of the leading end 90 of the T-shaped boss 80.

Figure 6:
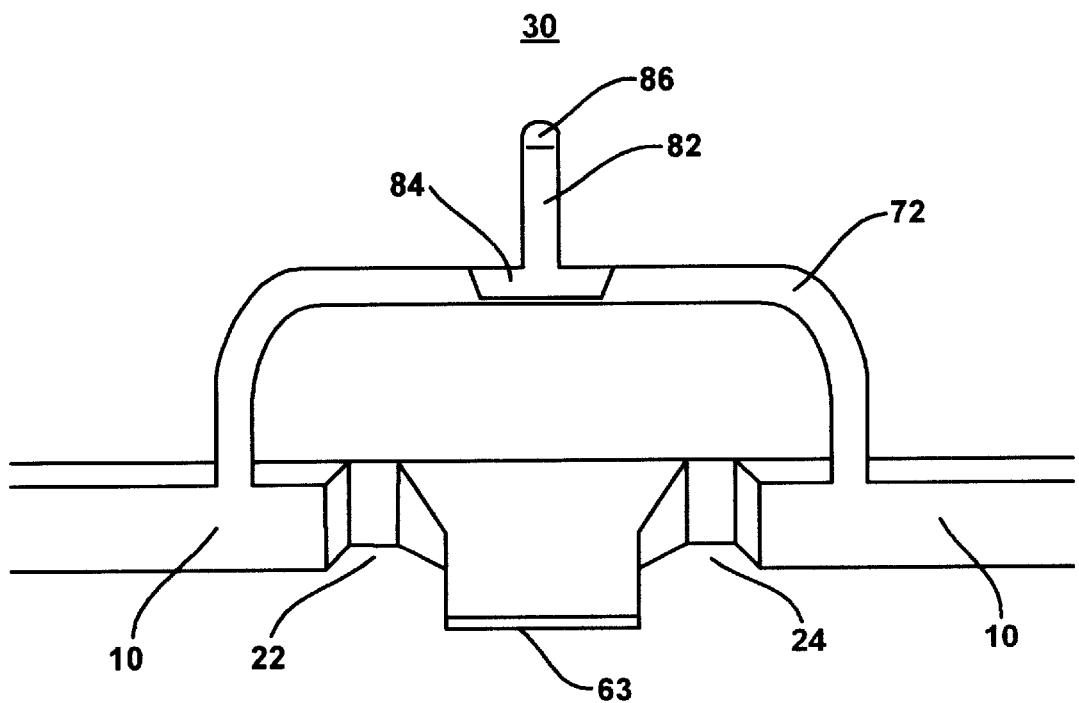
FIG. 6 illustrates a top view of an integrated positioning and locking device in accordance with an embodiment of the present invention.
Figure 7:
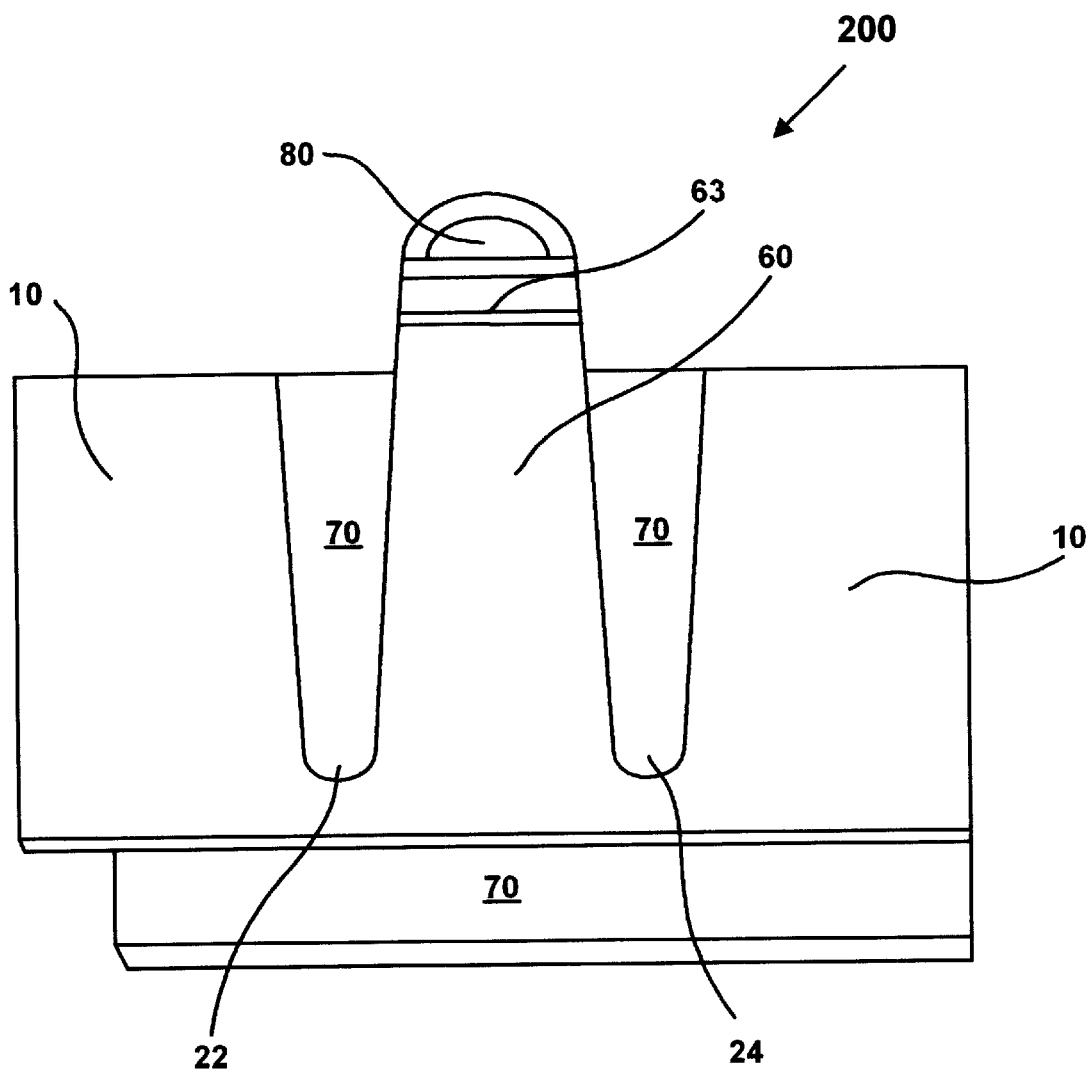
FIG. 7 illustrates an external side view of an integrated positioning and locking device in accordance with an embodiment of the present invention.

A top view of an integrated positioning and locking device 200 of FIG. 3 in accordance with an embodiment of the present invention is illustrated in FIG. 6. FIG. 7 illustrates an external side view of an integrated positioning and locking device 200 of FIG. 3 in accordance with an embodiment of the present invention.

Figure 8:
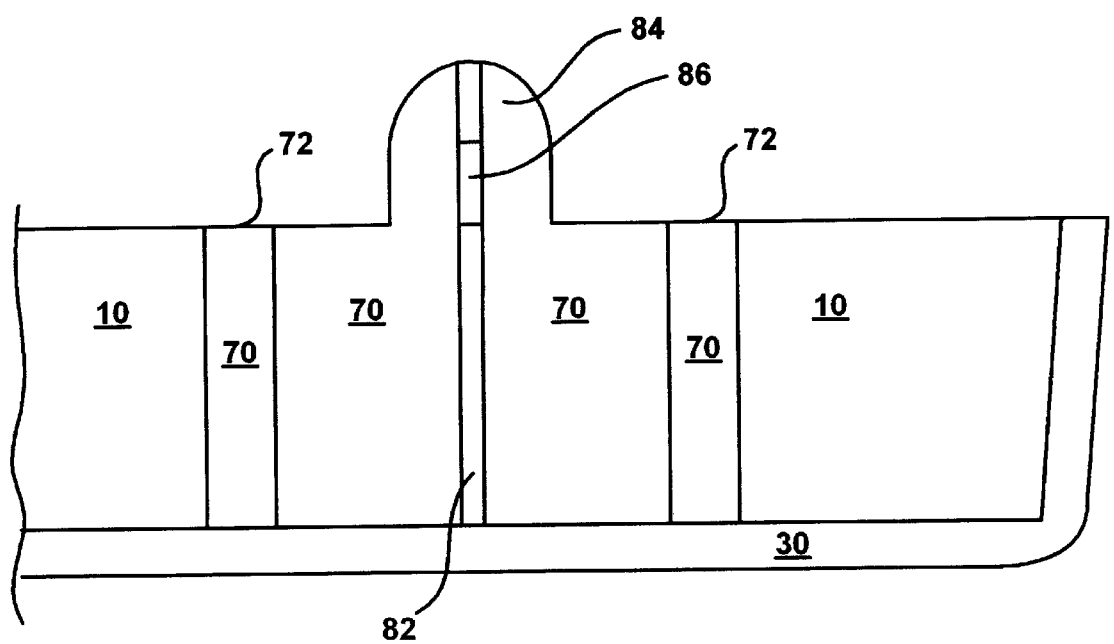
FIG. 8 illustrates an internal side view of an integrated positioning and locking device in accordance with an embodiment of the present invention.
Figure 9:
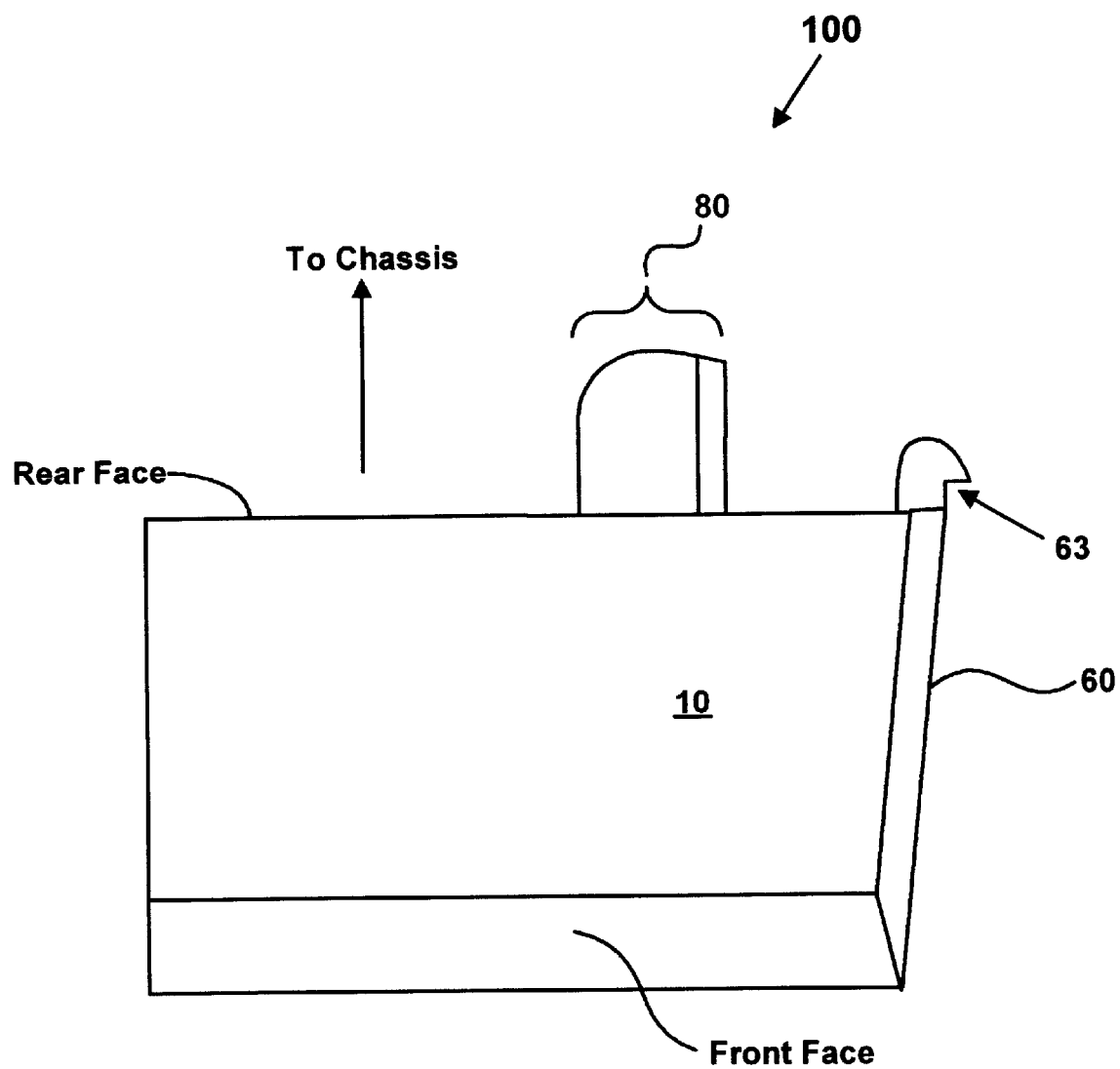
FIG. 9 illustrates a side view of the control panel of FIG. 1, showing a latch and a T-shaped boss of an integrated positioning and locking device in accordance with an embodiment of the present invention.

Moreover, an internal side view of an integrated positioning and locking device 200 of FIG. 3 in accordance with an embodiment of the present invention is illustrated in FIG. 8. FIG. 9 illustrates a side view of the control panel 100 of FIG. 1, showing a lip 63 of a latch 60 and a T-shaped boss 80 of an integrated positioning and locking device 200 of FIG. 3 in accordance with an embodiment of the present invention.

FIG. 10 illustrates a chassis 900 in accordance with an embodiment of the present invention. The chassis 900 is configured for mounting thereon the control panel 100 (FIGS. 1–2). The chassis 900 includes a front surface (or face) 910, positioning holes 940A and 940B for inserting therein a corresponding T-shape boss 80, and latching holes 930A and 930B for inserting therein a corresponding lip 63 of a latch 60.

Figure 11:
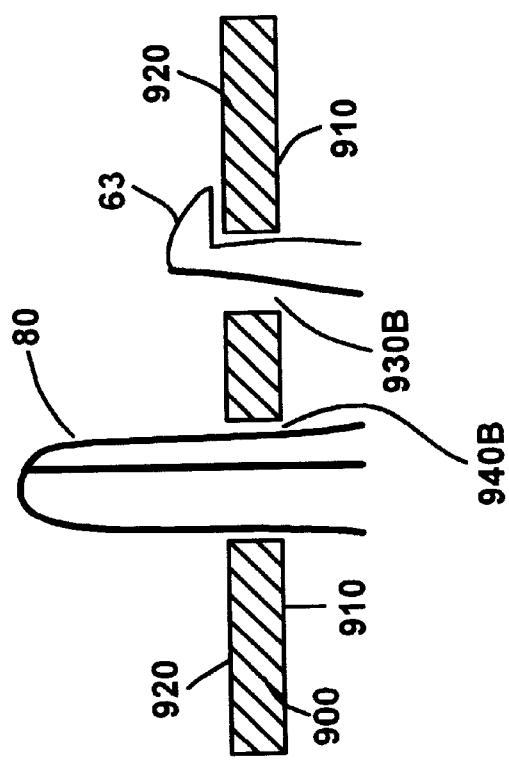
FIG. 11 illustrates a cross-sectional view taken along line A–A$^1$ in FIG. 10, showing how the control panel of FIG. 1 is installed onto the chassis of FIG. 10 in accordance with an embodiment of the present invention.
Figure 11:
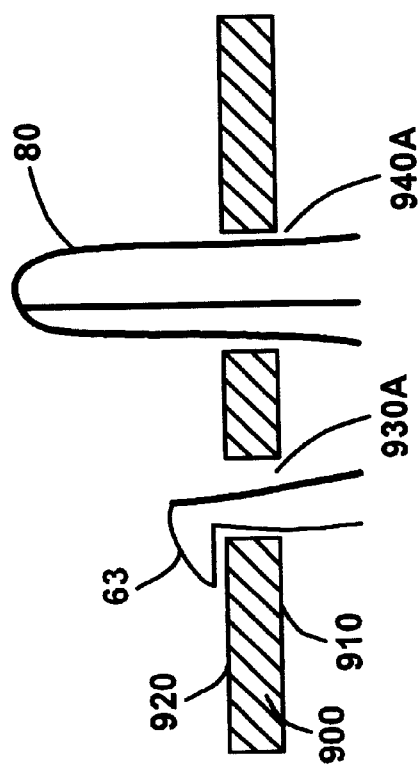

FIG. 11 illustrates a cross-sectional view taken along line A–A¹ in FIG. 10, showing how the control panel 100 of FIG. 1 is installed onto he chassis 900 of FIG. 10 in accordance with an embodiment of the present invention. As illustrated in FIG. 11, in the latched position, the lip 63 of each latch 60 latches against an opposite face 920 of the chassis 900. Each T-shaped boss 80 is inserted through the positioning holes 940A and 940B in the front face 910 of the chassis 900. Moreover, each lip 63 of each latch 60 is inserted through the latching holes 930A and 930B in the front face 910 of the chassis 900.

In practice, the installation of the control panel 100 onto the chassis 900 is easier and more robust than prior installation techniques. The control panel 100 is placed such that the leading end 90 of the T-shaped boss 80 is aligned with a corresponding positioning hole of the chassis 900. The alignment does not have to be perfect since the leading end 90 has a spherical shape to assist insertion into the corresponding positioning hole. Then, the control panel 100 is pressed such that the leading end 90 of the T-shaped boss 80 is inserted into the corresponding positioning hole. As the control panel 100 is moved closer to the front face 910 of the chassis 900, the latch 60 at each end of the control panel 100 is depressed to enable the lip 63 of the latch 60 to be inserted through a corresponding latching hole of the chassis 900. When the latch 60 is released, the latch 60 snaps back to a flush position with the external wall of the control panel 100, causing the lip 63 to latch securely against the opposite face 920 of the chassis 900. The T-shaped boss 80 and the inner wall 70 provide a stop and support for the control panel 100 against the front face 910 of the chassis 900. Thus, the control panel 100 rests firmly and locked against the chassis 900 in the installed position without requiring any hardware or tools. This reduces part count, installation steps, and costs. Removal of the control panel 100 is accomplished by reversing the installation steps.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated positioning and locking device for installing an assembly onto a chassis, comprising:
   a latch formed in an external wall of said assembly for latching against said chassis, wherein said latch includes a lip which points externally from said external wall;
   an inner wall for blocking access through said external wall to an internal region of said assembly when said assembly is in an installed position on said chassis; and
   a T-shaped boss integrated into said inner wall for positioning said assembly relative to said chassis to facilitate placing said latch into a latched position for locking said assembly in said installed position, wherein said T-shaped boss includes a leading end which guides said assembly into said installed position, is spherically shaped, and is higher than said inner wall and said latch.

2. The integrated positioning and locking device as recited in claim 1 wherein said T-shaped boss comprises a plurality of members, wherein said plurality of members includes a first member which is perpendicular to said inner wall and forms a vertical bar of said T-shaped boss and a second member which is extends parallel from a top edge of said inner wall to form an upper section of a cross bar of said T-shaped boss, and wherein said inner wall forms a lower section of said cross bar of said T-shaped boss.

3. The integrated positioning and locking device as recited in claim 1 wherein said assembly is a panel.

4. The integrated positioning and locking device as recited in claim 1 wherein said assembly is a housing.

5. The integrated positioning and locking device as recited in claim 1 wherein said assembly is a bezel.

6. An assembly for installing onto a chassis, comprising an external wall; and at least one integrated positioning and locking device for installing said assembly onto said chassis, said integrated positioning and locking device comprising:

a latch formed in said external wall for latching against said chassis, wherein said latch includes a lip which points externally from said external wall;

an inner wall for blocking access through said external wall to an internal region of said assembly when said assembly is in an installed position on said chassis; and a T-shaped boss integrated into said inner wall for positioning said assembly relative to said chassis to facilitate placing said latch into a latched position for locking said assembly in said installed position, wherein said T-shaped boss includes a leading end which guides said assembly into said installed position, is spherically shaped, and is higher than said inner wall and said latch.

7. The assembly as recited in claim 6 wherein said T-shaped boss comprises a plurality of members, wherein said plurality of members includes a first member which is perpendicular to said inner wall and forms a vertical bar of said T-shaped boss and a second member which is extends parallel from a top edge of said inner wall to form an upper section of a cross bar of said T-shaped boss, and wherein said inner wall forms a lower section of said cross bar of said T-shaped boss.

8. The assembly as recited in claim 6 wherein said assembly is a panel.

9. The assembly as recited in claim 6 wherein said assembly is a housing.

10. The assembly as recited in claim 6 wherein said assembly is a bezel.

11. A system comprising:

a chassis including a positioning hole and a latching hole; and an assembly in an installed position on said chassis, said assembly comprising an external wall and at least one integrated positioning and locking device for installing said assembly onto said chassis, said integrated positioning and locking device comprising:

a latch formed in said external wall for latching against said chassis through said latching hole, wherein said latch includes a lip which points externally from said external wall;

an inner wall for blocking access through said external wall to an internal region of said assembly; and a T-shaped boss integrated into said inner wall for positioning said assembly relative to said chassis to facilitate placing said latch into a latched position for locking said assembly in said installed position, wherein said T-shaped boss includes a leading end which guides said assembly into said installed position by being inserted into said positioning hole, is spherically shaped, and is higher than said inner wall and said latch.

12. The system as recited in claim 11 wherein said T-shaped boss comprises a plurality of members, wherein said plurality of members includes a first member which is perpendicular to said inner wall and forms a vertical bar of said T-shaped boss and a second member which is extends parallel from a top edge of said inner wall to form an upper section of a cross bar of said T-shaped boss, and wherein said inner wall forms a lower section of said cross bar of said T-shaped boss.

13. The system as recited in claim 11 wherein said assembly is a panel.

14. The system as recited in claim 11 wherein said assembly is a housing.

15. The system as recited in claim 11 wherein said assembly is a bezel.

16. A method of installing an assembly onto a chassis, said method comprising:

aligning a T-shaped boss of said assembly with a positioning hole of said chassis;

inserting a leading end of said T-shaped boss into said positioning hole by pressing said assembly onto said chassis;

depressing a latch of said assembly to enable a lip of said latch to be inserted through a latching hole of said chassis; and releasing said latch such that said lip latches against said chassis and locks said assembly to said chassis.

17. The method as recited in claim 16 wherein said assembly is a panel.

18. The method as recited in claim 16 wherein said assembly is a housing.

19. The method as recited in claim 16 wherein said assembly is a bezel.

20. The method as recited in claim 16 wherein said lip is inserted through said latching hole in a front face of said chassis and latches against an opposite face of said chassis.

* * * * *

UNITED STATES PATENT AND TRADEMARK OFFICE
CERTIFICATE OF CORRECTION

PATENT NO.    : 6,669,042 B1
DATED         : December 30, 2003
INVENTOR(S)   : Michael Wortman It is certified that error appears in the above-identified patent and that said Letters Patent is hereby corrected as shown below:

Column 6,
Line 60, after "which" delete "is"

Column 7,
Line 27, after "which" delete "is"

Column 8,
Line 16, after "which" delete "is"

Signed and Sealed this

First Day of February, 2005

JON W. DUDAS
*Director of the United States Patent and Trademark Office*